United States Patent [19]

Aoki et al.

[11] Patent Number: 5,276,722
[45] Date of Patent: Jan. 4, 1994

[54] ABSOLUTE MULTI-REVOLUTION ENCODER

[75] Inventors: Yukio Aoki; Takao Mizutani, both of Aichi, Japan

[73] Assignee: Mitsubishi Denki K.K., Tokyo, Japan

[21] Appl. No.: 917,955

[22] Filed: Jul. 24, 1992

[30] Foreign Application Priority Data

Jul. 30, 1991 [JP] Japan ........................ 3-189842

[51] Int. Cl.⁵ ............................................. G01D 5/34
[52] U.S. Cl. ...................................... 377/49; 377/15; 377/16; 377/17
[58] Field of Search .................... 377/49, 15, 16, 17

[56] References Cited

U.S. PATENT DOCUMENTS

| | | | |
|---|---|---|---|
| 3,745,544 | 7/1973 | Ono | 377/17 |
| 4,094,371 | 6/1978 | Ferrell | 377/17 |
| 4,475,163 | 10/1984 | Chandler et al. | 377/17 |
| 4,797,827 | 1/1989 | Cockerham | 377/17 |
| 4,931,792 | 6/1990 | Baginski | 377/17 |
| 4,951,300 | 8/1990 | Koike | 377/17 |
| 5,058,145 | 10/1991 | Hauck et al. | 377/17 |
| 5,127,035 | 6/1992 | Ishii | 377/17 |
| 5,187,724 | 2/1993 | Hibino et al. | 377/49 |

FOREIGN PATENT DOCUMENTS

60-137318 9/1985 Japan.
63-8513 1/1988 Japan.

*Primary Examiner*—William L. Sikes
*Assistant Examiner*—Scott A. Ouellette
*Attorney, Agent, or Firm*—Sughrue, Mion, Zinn, Macpeak & Seas

[57] ABSTRACT

A precision, high-resolution, absolute, multi-revolution encoder which allows a multi-revolution position value of a shaft to be detected with high reliability, using only a single revolution detector, and makes multi-revolution detection indirectly related to the accuracy of a rotary angle position signal. The output signal from the single multi-revolution detector is used, together with an inverted output signal, to increment and decrement corresponding up/down counters, based on the direction of rotation of the shaft. Each of the up/down counters is incremented or decremented at different points or zones of the shaft rotation so that the rotational value can be determined unambiguously. A conventional grey-code detector provides accurate angle values. The counters may exist as discrete hardware or integrated software embodiments.

13 Claims, 7 Drawing Sheets

VALUE OF UP/DOWN COUNTER 13

FIG. 4(b)

VALUE OF UP/DOWN COUNTER 14

FIG. 4(c)

INPUT SHAFT ROTARY ANGLE (DEGREES)

FIG. 5

| ABSOLUTE VALUE WITHIN 1 REVOLUTION | | COUNT VALUE C1 OF UP/DOWN COUNTER 13 | COUNT VALUE C2 OF UP/DOWN COUNTER 14 | MULTI-REVOLUTION VALUE CALCULATION EXPRESSION |
|---|---|---|---|---|
| ZONE | $\theta$ | | | |
| Z1 | $0° \leq \theta < 90°$ | 0 | 0 | $C_2$ |
| Z2 | $90° \leq \theta < 180°$ | 0 | 0 | $C_1$ |
| Z3 | $180° \leq \theta < 270°$ | 0 | 1 | $C_1$ |
| Z4 | $270° \leq \theta < 360°$ | 0 | 1 | $C_2 - 1$ |
| Z1 | $0° \leq \theta < 90°$ | 1 | 1 | $C_2$ |
| Z2 | $90° \leq \theta < 180°$ | 1 | 1 | $C_1$ |
| Z3 | $180° \leq \theta < 270°$ | 1 | 2 | $C_1$ |
| Z4 | $270° \leq \theta < 360°$ | 1 | 2 | $C_2 - 1$ |
| Z1 | $0° \leq \theta < 90°$ | 2 | 2 | $C_2$ |
| Z2 | $90° \leq \theta < 180°$ | 2 | 2 | $C_1$ |
| ⋮ | ⋮ | ⋮ | ⋮ | ⋮ |
| | | | | |
| | | | | |

ABSOLUTE MULTI-REVOLUTION ENCODER

BACKGROUND OF THE INVENTION

1. Field of the Invention

The present invention relates to an absolute multi-revolution encoder for detecting the absolute position of, for example, a drive shaft on a machine tool, robot, table and the like. Such encoder is important to determining the position of a machine during operation, where a programmed or an emergency stop is required and there is a need to restart the machine at an accurate position.

2. Description of the Background Art

Figure 7:
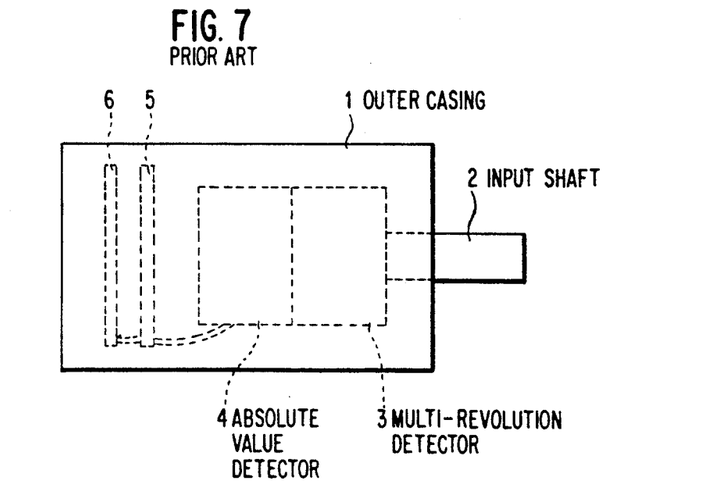
FIG. 7 is a structural diagram of an absolute multi-revolution encoder known in the art.

FIG. 7 shows the general structure of a conventional absolute multi-revolution encoder, wherein an outer casing 1 is penetrated by an input shaft 2 which has mounted thereon a multi-revolution detector 3. Also mounted on the input shaft 2 is an absolute-value detector 4. A printed circuit board 5 includes analog processing circuits for shaping the output from the detectors, and a printed circuit board 6 includes a circuit for digital processing the output of the analog processing circuits.

Conventionally, the absolute value decoder 4 comprises a patterned first disk that is fixed and an adjacent, parallel and patterned second disk that rotates with the shaft. A source of light (typically an LED) on one external side of the pair of parallel disks is directed toward photocells disposed on an opposite side of the pair of disks. The output of the photocells is determined by the overlaying patterns of the two disks and uniquely define an angular position in one revolution of the shaft.

The multi-revolution detector 3 is needed to identify the net rotational position of the shaft after multiple revolutions, particularly where the series of revolutions may change rotational direction several times during an operation of a machine. Conventionally, the detector 3 may be a magnetic resonance detector that generates two rotational position signals that differ in phase, depending on the direction of rotation, and the resultant phase from a comparison of the two signals will indicate the current direction of rotation.

Figure 8:
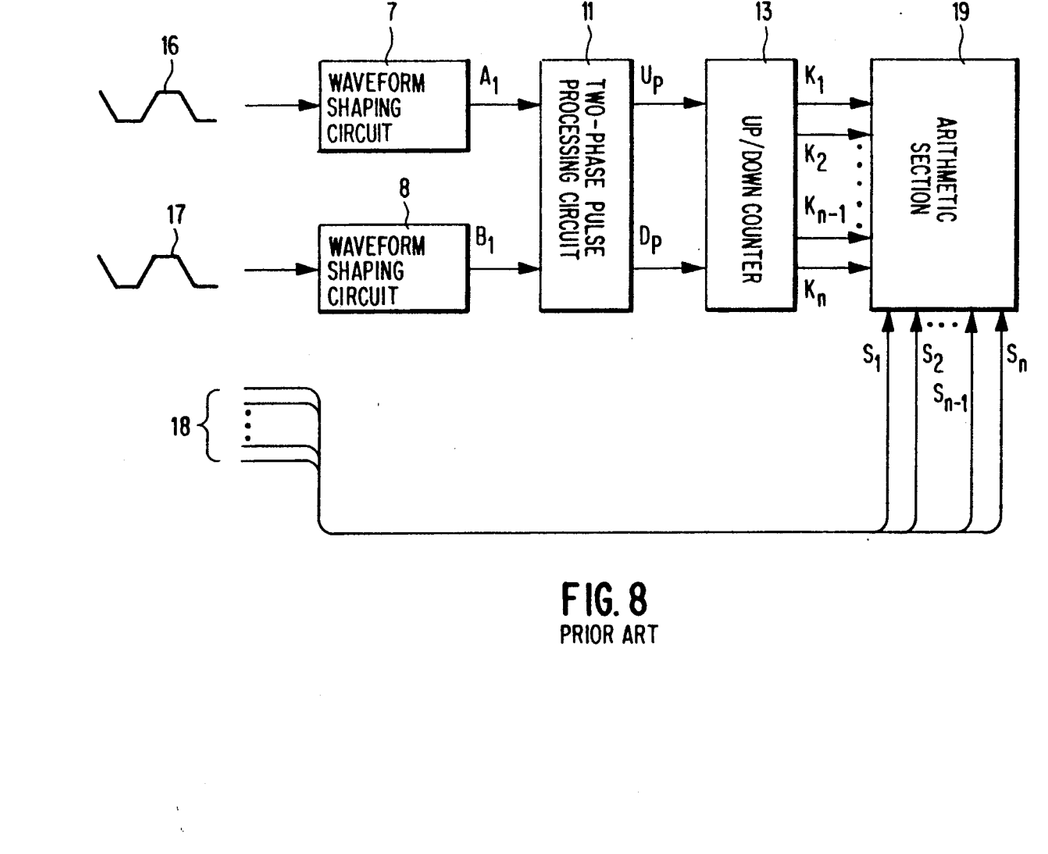
FIG. 8 is a block diagram of a conventional revolution detection signal processor.

FIG. 8 is a block diagram of the signal processors installed on the printed circuit boards 5, 6. Two waveform shaping circuits 7, 8 are provided for shaping the waveforms of two detection signals 16, 17, which are output by the multi-revolution detector 3 and are 90 degrees out of phase. The waveform shaping circuits generate respective signals A and B, which are amplified for digital processing but remain correspondingly out of phase. A two-phase pulse processing circuit 11 receives the two signals A, B and generates an output to an n-bit up/down counter 13. Counter circuit 13 outputs count signals $K_l$ through $K_n$ to an arithmetic section 19, which also receives m-bit rotary angle position signals $S_l$ through $S_m$ that are output on line 18 from the absolute-value detector 4.

The operation of the encoder will now be described in reference to the appended drawings. When the input shaft 2 rotates, its rotation is detected by the multi-revolution detector 3 which then outputs two multi-revolution detection signals 16, 17 which are 90 degrees out of phase. These multi-revolution detection signals 16, 17 are converted into up-count pulses or down-count pulses, corresponding to the rotation direction of the input shaft 2, via the waveform shaping circuits 7, 8 and the two-phase pulse processing circuit 11 in FIG. 8. The count pulses from pulse processing circuits 11 are input to the n-bit up/down counter 13, which then outputs n-bit counter values to the arithmetic section 19. The additional input of rotary angle position signals 18 from the absolute value encoder 4 permits the arithmetic section 19 to identify the absolute position of the shaft.

Figure 9:
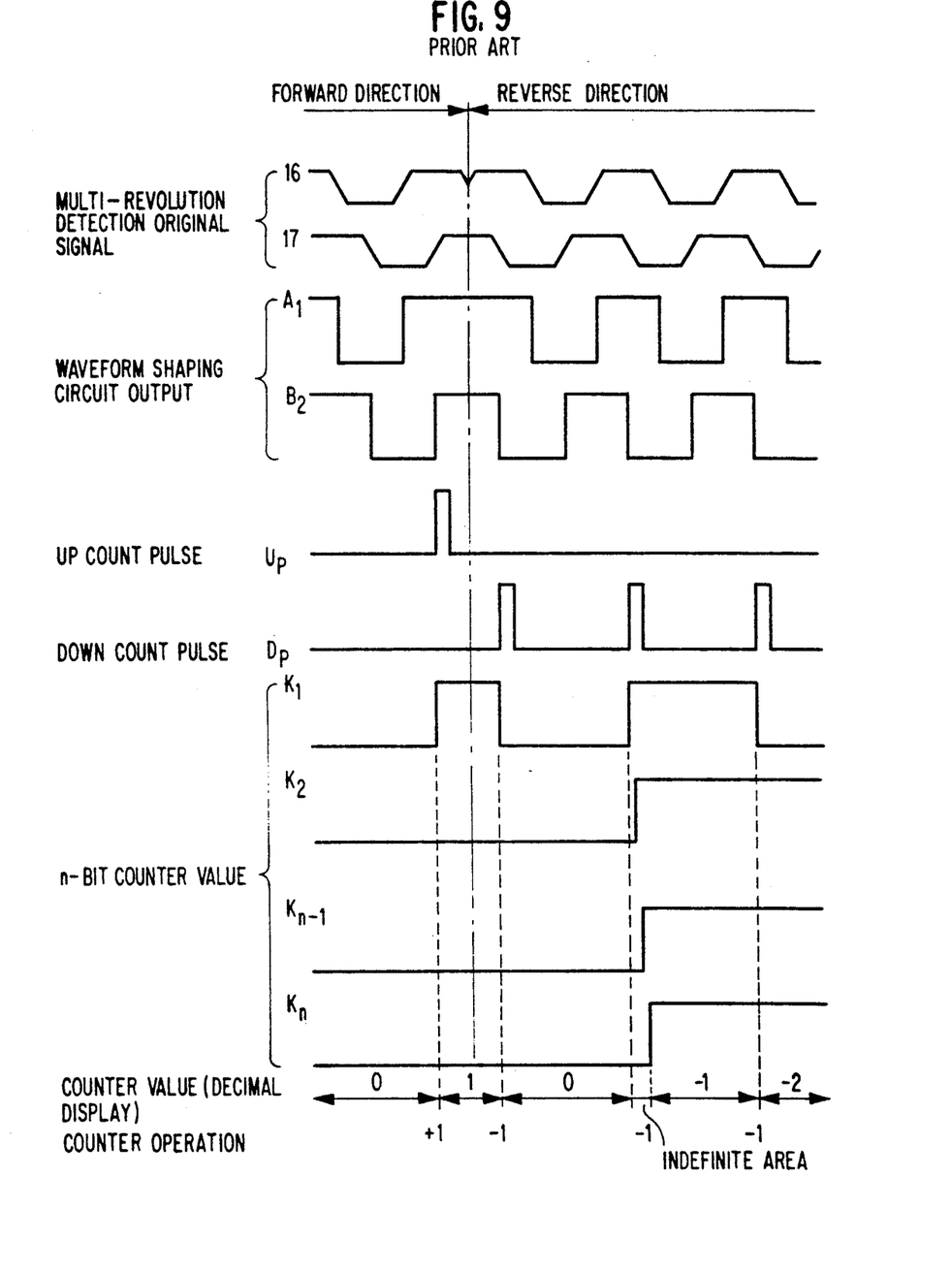
FIG. 9 is an illustration of signal waveforms that appear in the operation of the conventional encoder.

An example of the conventional circuit operation is illustrated in FIG. 9. Shown there are a variety of signals that are generated during multiple revolutions of the shaft 2, first in a forward direction by one revolution and 90° and then in a reverse direction by two revolutions. Initially, the original signals 16, 17 detected by detector 3 during the multiple revolutions of the shaft and input to the wave shaping circuits 7, 8 of FIG. 8, and the corresponding shaped outputs $A_l$ and $B_l$ from the circuits, are illustrated. Subsequently, the result of combinations of these conditions are also illustrated. For example, when (1) the input shaft is rotating in a forward direction, (2) the wavefrom shaping circuit output $A_l$ is HIGH, and (3) the waveform shaping circuit output $B_l$ is rising, an up-count pulse $U_P$ is output from the two-phase pulse processing circuit 11. As a result, up/down counter 13 will count up. By contrast, when (1) the input shaft is rotating in a reverse direction, (2) the waveform shaping circuit output $A_l$ is at a HIGH level, and (3) waveform shaping circuit output $B_l$ is falling, down-count pulse $D_P$ is output from two-phase pulse processing circuit 11 and up-down counter 13 will count down. The result of the above-described count is seen as the combination of N-bit signals that are output from counter 13 on lines $K_l$ to $K_n$ and a digital counter value that may be displayed in operator readable notation. Specifically, the counter which proceeds in accordance with the illustrated example will first generate a +1 pulse and then three successive −1 pulses, the accumulated count thereby varying from 0 to +1, to 0, to −1, to −2.

Conventionally, this count operation is adjusted beforehand by the multi-revolution detector 3 so as to be performed only at a position where a rotary angle position signal 18, as described below, corresponds to zero degrees.

The output signal of the absolute-value detector 4 is converted into the encoded m-bit rotary angle position signals $S_l$ to $S_m$ on lines 18, i.e. a special code referred to as a gray code that conventionally assumes values that correspond to angles from 0 degrees to 360 degrees. Specifically, the output of the detector 4 is processed by an operational amplifier, a comparator or the like (not illustrated) on the waveform shaping printed circuit board 5, and is input to the arithmetic section 19. The arithmetic section 19 calculates an m-bit rotary angle value on the basis of the m-bit rotary angle position signals $S_l$ through $S_m$ on lines 18 entered, synthesizes the rotary angle value with the n-bit counter value already read, and serially outputs the result as an m+n-bit absolute-value signal.

In the above mentioned structure of the conventional absolute multi-revolution encoder, incorrect data may be output by the arithmetic section 19 for several reasons. First, the counter value of the up/down counter 13 is read into the arithmetic section 19 while the up/down counter 13 is just beginning to perform the count operation (in an indefinite area defined by the rising edge of the counter pulse $K_l$ and the rising edge of the counter pulse $K_n$, as seen in FIG. 9). Second, incorrect data on one revolution may be output if an offset between a point of the count operation and a zero point of the rotary angle position signal is greater than the resolution of the rotary angle position. Temperature variations in the working environment or vibration can affect the resolution of the position detector. Further, incorrect data may also be output if a hysteresis effect is large due to the forward and reverse rotations of the input shaft.

A further difficulty is that the maintenance of an absolute rotational value requires memory to count up/down the number of revolutions and the count would be lost if a power failure occurs, necessitating an initialization of the entire detector system.

SUMMARY OF THE INVENTION

The object of the present invention is to overcome the disadvantages in the conventional encoder by providing an absolute multi-revolution encoder having high accuracy and high resolution.

A further object of the present invention is to provide an absolute multi-revolution encoder wherein only a single revolution detecting element may be used to determine the revolution number without ambiguity.

Yet another object of the present invention is to provide an absolute multi-revolution encoder wherein a combination of a rotary angle detector and a multi-revolution encoder may be used to determine the absolute rotational position without ambiguity.

These and other objects are realized by the apparatus and method of the present invention whereby the rotation of a shaft is detected and used as the basis for the up/down count of first and second counters, each counter being incremented in response to signals corresponding to different rotary angles of the shaft, and a selection is made of one of the two counters for count processing on the basis of a detected rotary angle position of the shaft.

The apparatus and method of the present invention further comprises the arithmetic processing, comprising the modification of the detected count by a predetermined value, on the basis of the detected rotary angle position.

DESCRIPTION OF THE PREFERRED EMBODIMENTS

Figure 1:
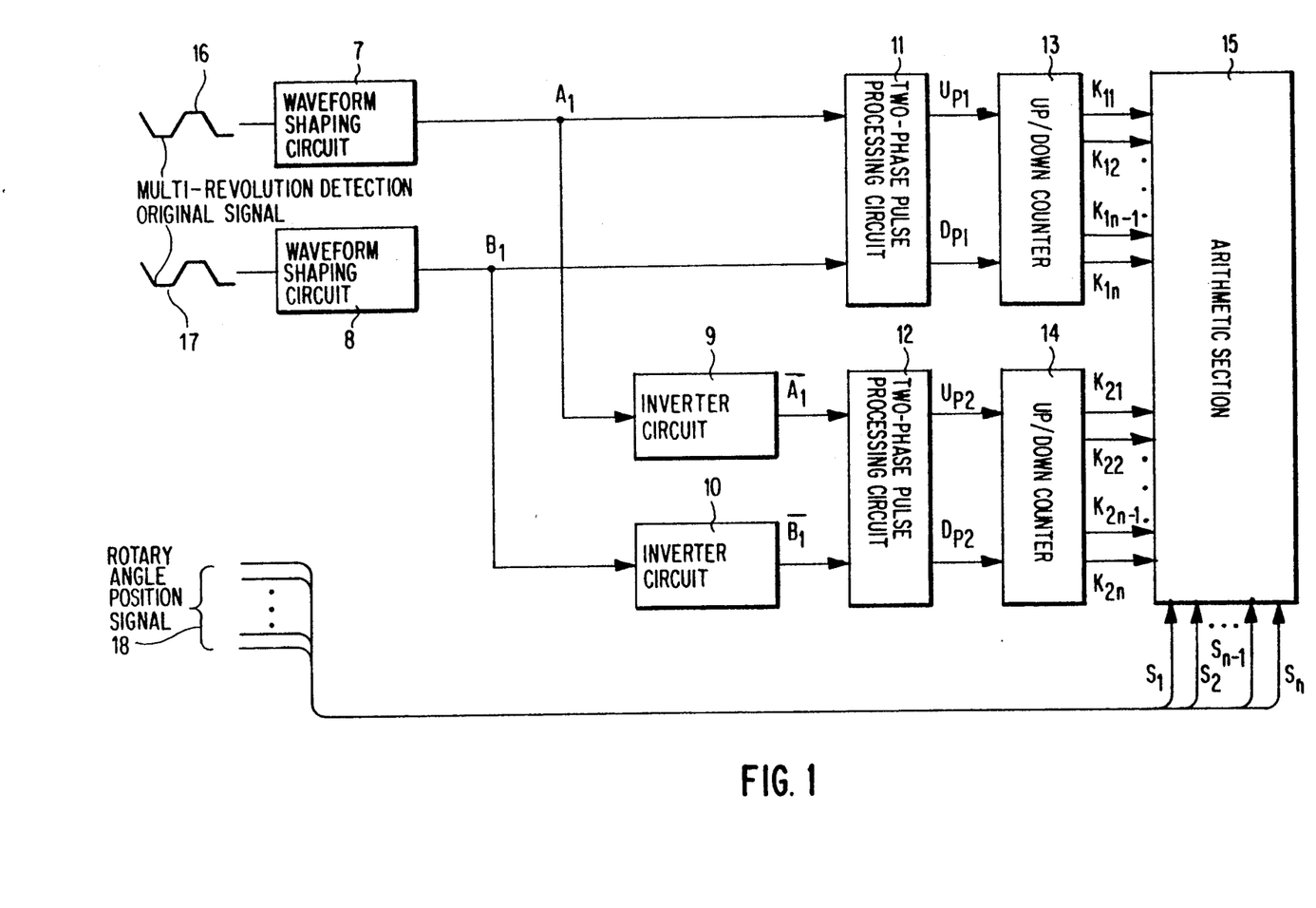
FIG. 1 is a block diagram of revolution detection signal processors in a first embodiment of the present invention.

FIG. 1 is a block diagram of detection signal processors illustrating a first embodiment of the present invention, wherein the numerals 1 to 6 indicate parts identical to those in the conventional device. Further, the waveform shaping circuits 7, 8 and their outputs A and B, the two-phase pulse processing circuit 11, the up/down counter 13, the two signals 16, 17 which are output by the multi-revolution detector 3 and out of phase with respect to the rotation of the input shaft 2, and the m-bit digital signal 18 converted from the output signal of the absolute-value detector 4 are substantially the same as those in the conventional encoder. The output of circuit 11 is identified as $U_{P1}$ and $D_{P1}$ and the outputs of counter 13 are identified as $K_{1l}$ through $K_{1n}$.

The first embodiment adds inverter circuits 9, 10 for inverting the two output signals A, B that were shaped by the waveform shaping circuits 7, 8, respectively, and producing corresponding signals $\overline{A}$ and $\overline{B}$. A two-phase pulse processing circuit 12 is added for converting the inverted output signals $\overline{A}$, $\overline{B}$ into up count pulses $U_{P2}$ or down count pulses $D_{P2}$ corresponding to the rotation direction of the input shaft 2. Also added to this embodiment is an n-bit up/down counter 14, which receives the up/down count pulses from circuit 12 and produces a count valve represented by signals on lines $K_{2l}$ through $K_{2n}$. The count value outputs from counters 13 and 14, as well as the rotary angle position signals on line 18 are input to arithmetic section 15. All of circuits 7–15 are placed on the digital processing printed circuit board 6.

Figure 2:
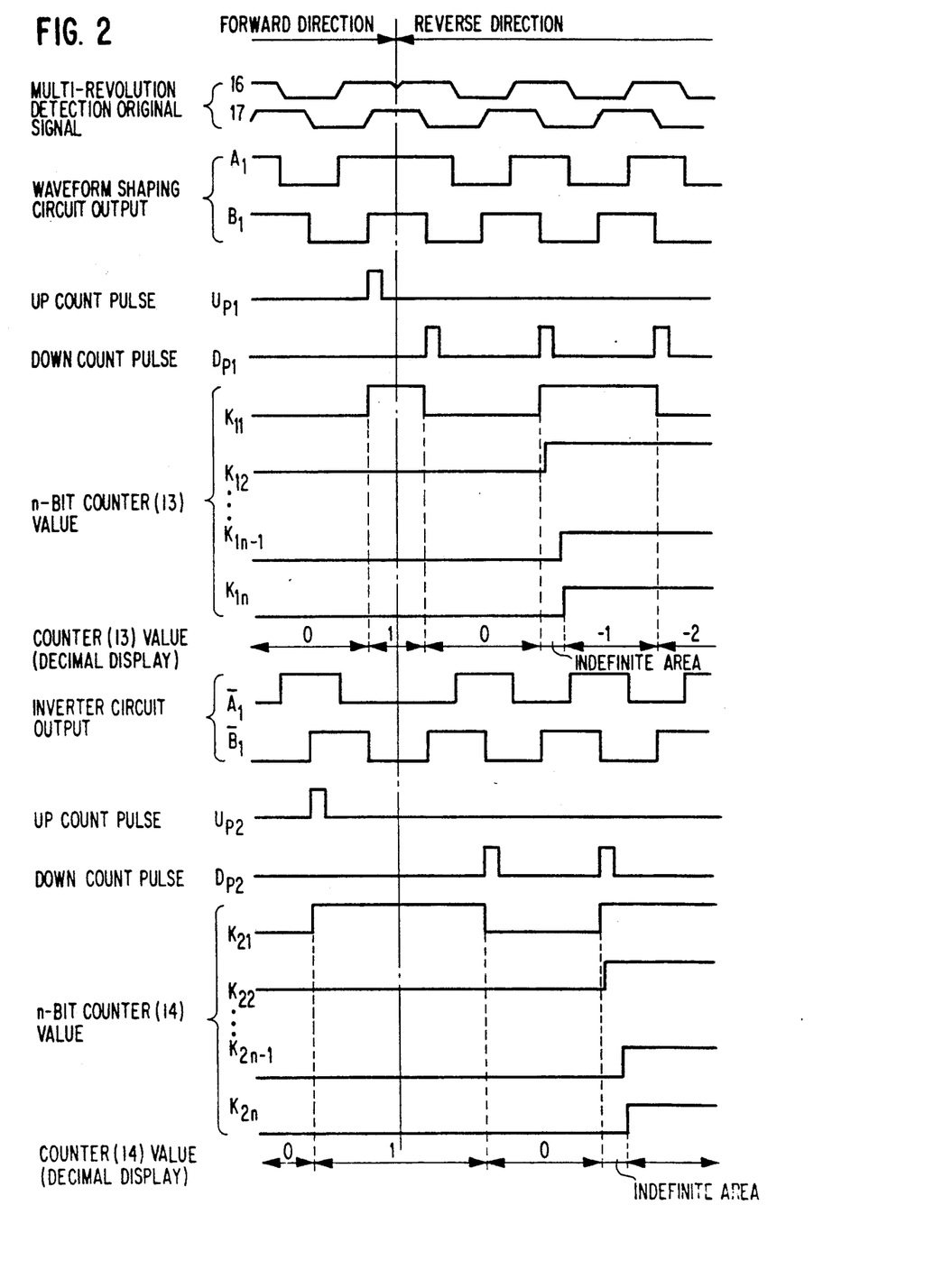
FIG. 2 illustrates output signal waveforms in the first embodiment of the present invention.

FIG. 2 illustrates signals that exist during an operation of the first embodiment when the input shaft 2 rotates in a reverse direction after it has rotated one revolution and 90 degrees in a forward direction.

The operation of the encoder will now be described in accordance with the appended drawings. When the input shaft 2 rotates, its rotation is detected by the multi-revolution detector 3 which then outputs two detection signals 16, 17 which have a cycle of one revolution and are 90 degrees out of phase with respect to the rotation of the input shaft 2. These original multi-revolution signals 16, 17 are shaped by the waveform shaping circuit 7, 8 and are input intact as signals A, B to the two-phase pulse processing circuit 11 and also are input to the inverter circuits 9, 10 where they are inverted into corresponding signals $\overline{A}$ and $\overline{B}$. The inverted signals input to the other two-phase pulse processing circuit 12. In each of the two-phase pulse processing circuits 11, 12, the two pairs of signals (A, B; $\overline{A}$, $\overline{B}$) are further converted into up count pulses or down count pulses corresponding to the rotation direction of the input shaft 2 and are input intact to their corresponding n-bit up/down counters 13, 14. Each of counters 13, 14 outputs n-bit counter values ($K_{1l}$ to $K_{1n}$; $K_{2l}$ to $K_{2n}$, respectively).

The two-phase pulse processing circuits 11, 12 and the up/down counters 13, 14 are designed, as shown by the waveforms in FIG. 2, to count up if waveform shaping circuit output $B_l$ is switched high when waveform shaping circuit output $A_l$ is high, and counts down if the waveform shaping circuit output $B_l$ is switched low when the waveform shaping circuit output $A_l$ is high. The count windows for the counters 13, 14, i.e. the position of the input shaft 2 where the counters are gated to generate the up count pulses or down count pulses, are preset by the multi-revolution detector 3. Specifically, the gating occurs when $\theta$, which represents the rotary angle of the input shaft 2 as illustrated in FIG. 3, is in the neighborhood of 0 degrees for the counter 13 and $\theta$ is in the neighborhood of 180 degrees for the counter 14.

As in the conventional encoder, the signal concerning the rotary angle detected by the absolute-value detector 4 is converted into the m-bit rotary angle position signal 18 by the operational amplifier, the comparator or the like (not illustrated) on the waveform shaping printed circuit board 5 and is input to the arithmetic section 15.

Figure 3:
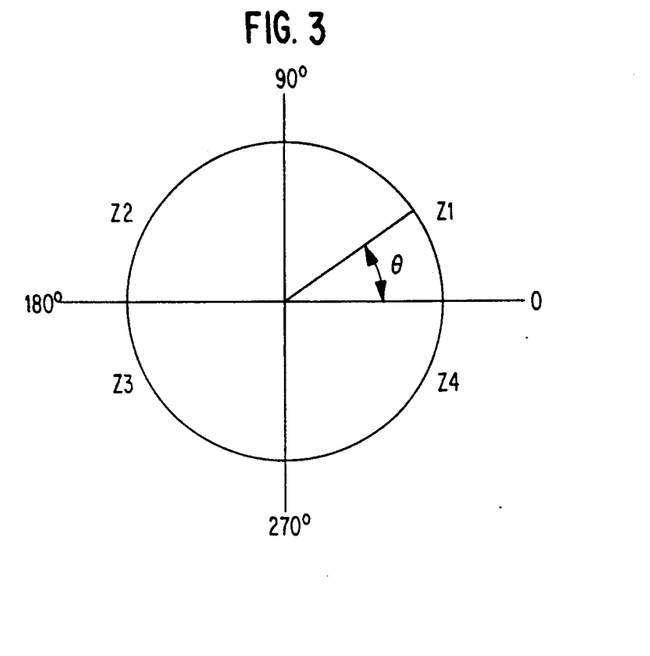
FIG. 3 shows relationships between the rotary angle of an input shaft and the count points of up/down counters in the first embodiment of the present invention.

The arithmetic section 15 calculates the rotary angle of the input shaft 2 on the basis of the m-bit rotary angle position input signal 18 and determines which of the four equally divided areas of one revolution, as shown in FIG. 3, the rotary angle $\theta$ falls within. Namely, the arithmetic section 15 judges which of the zones Z1-Z4 contains the rotary angle of the input shaft 2, i.e. a Z1 zone of $0° \leq \theta < 90°$, a Z2 zone of $90° \leq \theta < 180°$, a Z3 zone of $180° \leq \theta < 270°$, or a Z4 zone of $270° \leq \theta < 360°$. The arithmetic section also calculates the revolution value by reading the counter value of either of the two up/down counters 13, 14 according to the judgement result. The multi-revolution value (n bits) and the rotary angle (m bits) thus calculated are synthesized and output as a serial, n+m-bit absolute-value signal.

Figure 4A:
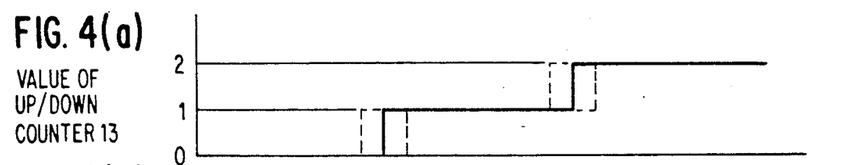
FIGS. 4(a)-4(c) relationships between the rotary angle of the input shaft, counter values and angle zones in the first embodiment of the present invention.
Figure 4B:
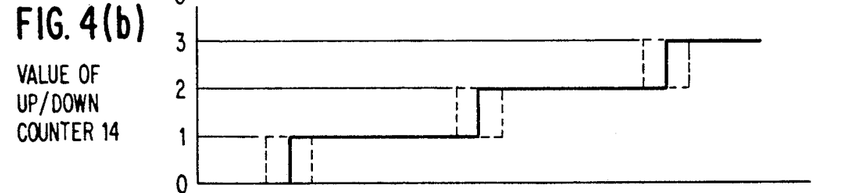
Figure 4C:
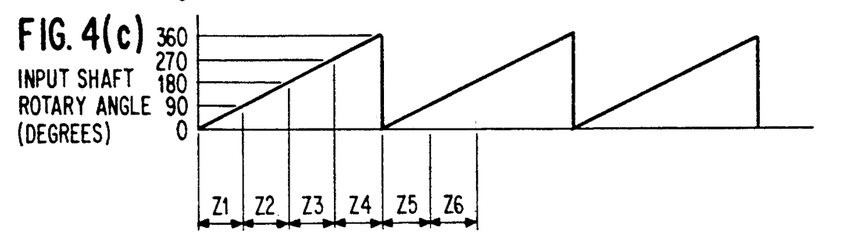

A method of calculating the multi-revolution value will now be described with respect to FIGS. 3, 4(a)-4(c) and 5. Initially, the zero point in the shaft rotation is determined and the counter set to zero at that point. It should be noted that the up/down counters 13, 14 are reset in the Z1 zone. Then, as the input shaft 2 rotates, relationships between the rotary angle, the counter values of the up/down counters 13, 14, and the zones change, as shown in FIGS. 4(a), 4(b) and 4(c). These relationships may further be summarized by the table illustrated in FIG. 5.

Turning first to FIG. 4(c), the angular value corresponding to each of zones Z1-Z4 are illustrated and appear as a triangular wave that rises as the shaft rotates from zone Z1 to zone Z4 and then falls to zero at the transition from zone Z4 to zone Z1. At the transition from zone Z2 to Z3, within a broad tolerance range identified by the dotted lines, the counter 14 is incremented from a 0 to a +1 count, as seen in FIG. 4(b). Then, at the transition from zone Z4 to Z1, the counter 13 is incremented from 0 to +1, as seen in FIG. 4(a). Similar incremental increases occur at the same transition points for the second and third rotations of the shaft. Of course, the count would decrease for rotations in an opposite direction.

Figure 5:
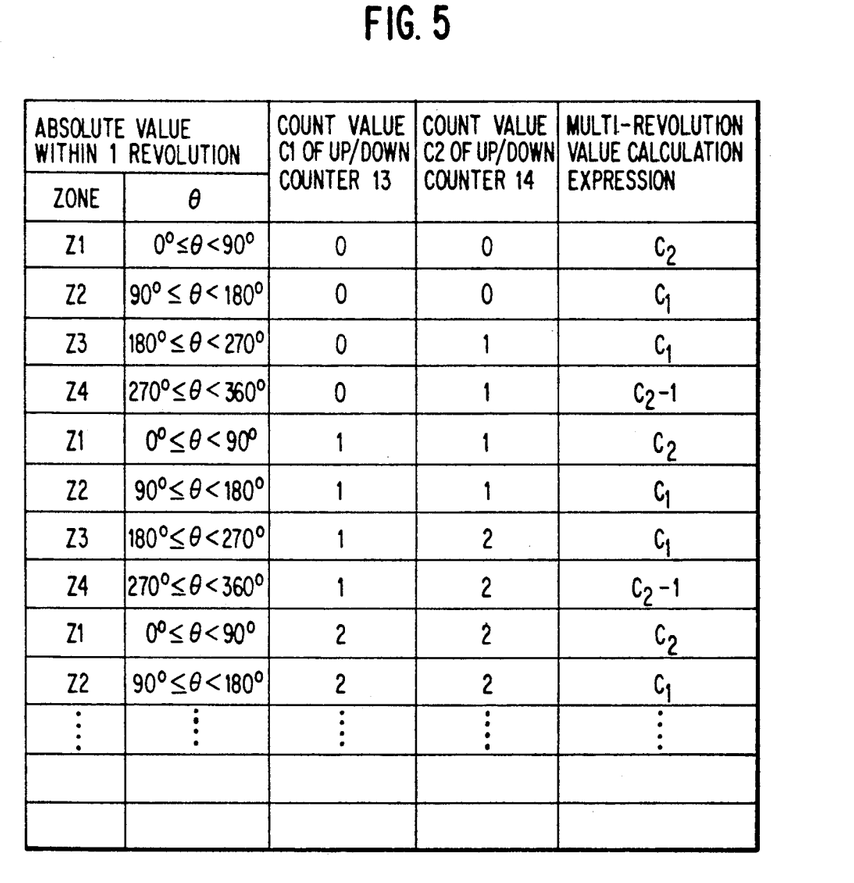
FIG. 5 indicates relationships between the angle zones and the counter values in the first embodiment of the present invention.

According to FIG. 5, the counter value C1 of the up/down counter 13 is 0 in each zone during the first revolution and changes to 1 beginning in the Z1 zone of the second revolution. The counter value C2 of the up/down counter 14 is 0 during the Z1 zone and the Z2 zone of the first revolution and is 1 during from the Z3 zone of the first revolution through the Z2 zone of the second revolution. The point where the counter value C1 of the counter 13 changes (i.e., is in an indefinite area between the rising edge of down count pulse $K_{1l}$ and the rising edge of pulse $K_{ln}$) is in the vicinity of 0 degrees in the Z1 zone, i.e., during a transition from Z4 to Z1. At this time, therefore, reading the counter value C2 of the other counter 14 which does not change in counter value as indicated in FIG. 5 allows the multi-revolution value to be found without using the changing counter value, and thereby avoids the problem encountered by the conventional encoder. Similarly, the counter value C1 of the counter 13 is read at a point where the counter value C2 of the counter 14 changes (i.e., is in an indefinite area between the rising edge of pulse $K_{21}$ and the rising edge of pulse $K_{2n}$).

According to this procedure, therefore, the arithmetic section 15 reads the counter value C2 of the counter 14 in the Z1 zone and the counter value C1 of the counter 13 in the Z2 and Z3 zones. Further, the counter value C2 of the counter 14 is read by section 15 and subtracts a value of 1 in the Z4 zone. On the basis of the values thus read, each value of rotary angle for multiple revolutions of the shaft may be accurately calculated for any rotary angle position. Moreover, the determination may be made with the use of only a single multi-revolution detector element.

According to the structure of the present invention as described above, the counter value is not read when the up/down counter is changing, i.e. while the count operation is performed, and therefore incorrect data is not output from the arithmetic section. In addition, if an offset between the count point of the counter and the zero point of the rotary angle position signal is greater than the resolution of the rotary angle position, there is no possibility that incorrect data is output. Further, incorrect data is not output if hysteresis is large due to the forward and reverse rotations of the input shaft.

A similar operation is expected if the two multi-revolution detection signals employed in the first embodiment are replaced by three or more multi-revolution detection signals.

Figure 6:
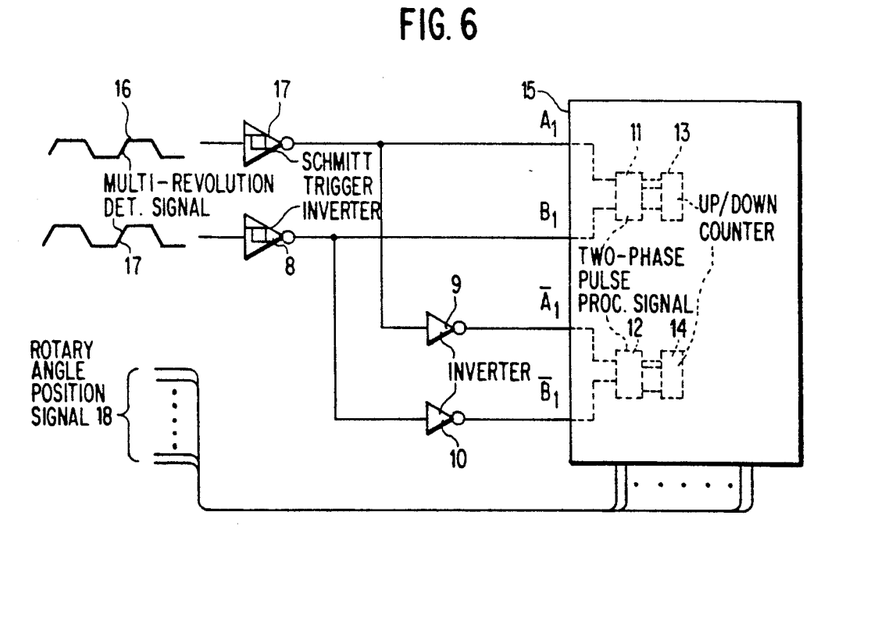
FIG. 6 is a block diagram of a revolution detection signal processor applicable to a second embodiment of the present invention.

In a second embodiment, as illustrated in FIG. 6, the waveform shaping circuits 7, 8 use Schmitt trigger inverters and the arithmetic section 15 employs a microcomputer incorporating the two-phase pulse processing circuits 11, 12 and the two up/down counters 13, 14. As compared to the first embodiment shown in FIG. 1, the second embodiment may have the advantage of low cost manufacture since the number of parts is smaller and the circuit is simpler.

It will be apparent that the present invention, as described above, provides a precision, high-resolution, absolute, multi-revolution encoder which allows a multi-revolution value to be detected with high reliability without enhancing the accuracy of revolution detection signals and makes multi-revolution detection indirectly related to the accuracy of a rotary angle position signal.

What is claimed is:

1. An absolute multi-revolution encoder comprising:
    an absolute-value detector for detecting a rotary angle position within one revolution of a shaft;
    a multi-revolution detector for detecting the number of revolutions of said shaft;
    first up/down counter means for receiving via two-phase pulse processing means at least two out-of-phase, multi-revolution detection signals output by said multi-revolution detector;
    second up/down counter means for receiving said multi-revolution detection signals via inverter means and two-phase pulse processing means; and
    an arithmetic section for determining the rotary angle position of said shaft by receiving a rotary angle detection signal output by said absolute-value detector,
    wherein said arithmetic section selects one of said first and second up/down counter means according to the rotary angle position of said shaft and reads the counter value of the selected up/down counter means.

2. An absolute multi-revolution encoder, as defined in claim 1, further comprising:
 a wave form shaping circuit, disposed between said multi-revolution detector and said two-phase pulse processing means for shaping the waveforms of said multi-revolution detection signals, said wave form shaping circuit comprising a Schmitt trigger inverter,
 wherein said two-phase pulse processing means and said up/down counting means are processor-based.

3. An absolute multi-revolution encoder for detecting the rotary position of a shaft comprising:
 a multi-revolution detector for detecting a revolution of said shaft and generating detection signals;
 a first counter for counting up and down on the basis of said detection signals;
 a second counter for counting up and down on the basis of said detection signals; and
 an arithmetic section for selecting one of said first and second counters according to the rotary angle position of said shaft and reading the counter value of the selected counter.

4. An absolute multi-revolution encoder, as defined in claim 3, further comprising:
 an absolute-value detector for detecting a rotary angle position within one revolution of said shaft and generating a rotary angle position signal;
 wherein said arithmetic section determines the multi-revolution value of said shaft on the basis of said rotary angle position signal.

5. An absolute multi-revolution encoder, as defined in claim 3, further comprising:
 means for generating a first signal on the basis of said detection signals;
 means for generating a second signal on the basis of an inverted first signal; and
 whereby, said first and second signals are fed respectively to said first and second counters.

6. A method of determining an absolute encoded position of a member that is selectively rotatable for multiple revolutions and in opposite directions, comprising the steps of:
 establishing a reference position for said member;
 detecting a rotational movement past said reference position;
 generating first and second detection signals as a result of said detecting step;
 separately counting up and down on the basis of said first and second detection signals to thereby generate counts of said first and second detection signals, respectively;
 detecting the rotary angle position of said member and generating a rotary angle position information; and
 combining said rotary angle position information with said counts of said first and second detection signals and, on the basis thereof, determining an absolute encoded position of said member,
 wherein one of the counts of said first and second detection signals is not utilized to determine rotation position when said member is at a rotary angle position where said one of the counts of said first and second detection signals is changing.

7. The method of determining an absolute encoded position as set forth in claim 6, wherein said count of said first and second detection signals are changed at respective rotational positions separated by at least 90 degrees.

8. The method of determining an absolute encoded position as set forth in claim 6, wherein said generating step further comprises:
 producing two phase-separated signals based on said detection signals as a first signal, and inverting said first signal to produce a second signal.

9. The method of determining an absolute encoded position as set forth in claim 8, wherein said generating step further comprises:
 converting said first signal and said second signal into at least one of up-count and down count pulses.

10. The method of determining an absolute encoded position as set forth in claim 6, wherein the rotational movement of said member is divided into zones and said counting step comprises:
 counting said first detection signal when said member is in a first zone and counting said second detection signal when said member is in a second zone, different from said first zone.

11. The method of determining an absolute encoded position as set forth in claim 10, further comprising:
 subtracting from said counts when determining the absolute encoded position if said member is in a predetermined zone.

12. A method of determining an absolute encoded position of a member that is selectively rotatable for multiple revolutions and in opposite directions, comprising the steps of:
 establishing a reference position for said member;
 detecting a rotational movement past said reference position;
 generating first and second detection signals as a result of said detecting step, said generating step including producing two phase-separated signals based on said detection signals as a first signal and inverting said first signal to produce a second signal;
 separately counting up and down on the basis of said first and second detection signals to thereby generate counts of said first and second detection signals, respectively; and
 determining said absolute encoded position on the basis of the counts resulting from said counting step.

13. The method of determining an absolute encoded position as set forth in claim 12, wherein said generating step further comprises:
 converting said first signal and said second signal into at least one of up-count and down-count pulses.

* * * * *